United States Patent [19]

D'Antonio

[11] 4,387,307
[45] Jun. 7, 1983

[54] ELECTRONIC SAFETY SKI BINDING RELEASE

[76] Inventor: Nicholas D. D'Antonio, 7695 Admiral Dr., Liverpool, N.Y. 13088

[21] Appl. No.: 173,493

[22] Filed: Jul. 29, 1980

[51] Int. Cl.³ ............................ G06G 7/18; A63C 9/08
[52] U.S. Cl. ..................................... 307/119; 280/612; 280/613
[58] Field of Search ........................ 280/611, 612, 613; 364/835; 307/117, 116, 119, 120, 121, 124

[56] References Cited

U.S. PATENT DOCUMENTS 3,907,316  9/1975  Marker et al. ................... 280/613 X
4,309,760  1/1982  D'Antonio ........................ 280/612 X Primary Examiner—G. Z. Rubinson
Assistant Examiner—James L. Dwyer
Attorney, Agent, or Firm—Squire, Sanders & Dempsey

[57] ABSTRACT

A system for processing analog electrical input signals to produce output signals having frequencies determined by electrical adapting signals, in which the adapting signals may depend upon characteristics of the input signals.

12 Claims, 10 Drawing Figures

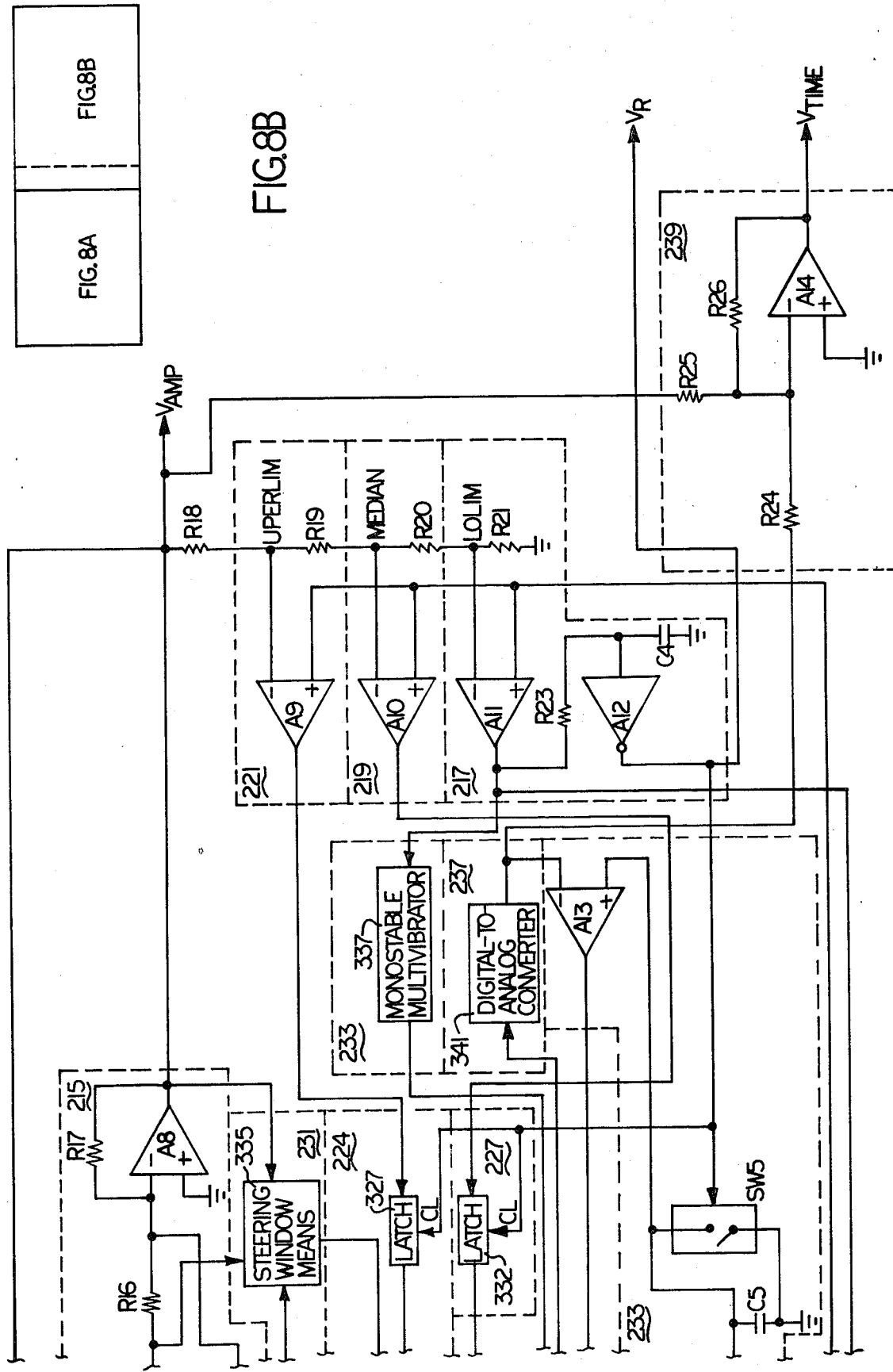

ELECTRONIC SAFETY SKI BINDING RELEASE

BACKGROUND OF THE INVENTION

This invention relates to the processing of electrical signals, particularly to the conversion of analog input signals, having amplitudes varying in response to various stimuli, into output signals having frequencies determined by the characteristics of the input signals. The invention further relates to the measurement over time of forces and moments, and the generation and processing of electrical signals corresponding to the measured forces and moments. The invention also relates to electronic ski binding systems wherein a safety binding may be placed in a releasing condition from a locking condition upon the generation of electrical signals indicative of forces or moments that may injure a skier.

Electrical circuits incorporating sensors, transducers, and other signal sources produce analog electrical signals, that is, signals having amplitudes indicative of the magnitudes of various stimuli. The evaluation of the cumulative effect of these stimuli for generation of responses requires the measurement of these input signals over time. Processing of such signals by fixed parameter digital and analog techniques is known in the art. Such digital techniques commonly employ analog-to-digital signal conversion circuitry to convert the analog input signals to a digital form suitable for processing in digital circuitry. Typically, both digital and analog techniques for measurement over time, e.g., integration, of signals, use fixed integration parameters.

Because of the advantages digital signal processing offers in comparison to analog signal processing, it is desirable that a digital system with variable parameters be available. However, in many applications it is not desirable to use circuitry employing analog-to-digital signal converter circuits because of their relative high cost and power consumption. These disadvantages are particularly felt in consumer products, especially in those which must have a remote power source. An example is a battery-powered electronic ski binding, that is, a ski binding where the forces and/or moments between a ski and a skier's boot are electrically measured to generate corresponding signals. The signals are processed to determine whether or not to generate a trigger signal to actuate the release means of the binding. The release means switches the binding mechanism from its latching condition, in which the boot is firmly grasped, to the releasing condition, in which the boot is released from the binding.

It is known in the art to convert an analog electrical signal into an output signal having a frequency proportional to the amplitude of the analog signal. The cumulative effect of the input signal may then be measured by counting and accumulating the number of cycles of output signal generated using conventional digital counter circuitry. For an example, see Titus, et al., *Microcomputer-Analog Converter Software and Hardware Interfacing* (Howard W. Sams & Co. 1978) pp. 117-120. This known circuitry avoids the use of an analog-to-digital signal converter in achieving fixed parameter digital integration.

SUMMARY OF THE INVENTION

It is an object of the present invention to convert an analog electrical input signal into an output signal having a frequency dependent upon various parameters which may include the characteristics of the input signal.

Another object of the present invention is to convert analog input signals into output signals having frequencies related to the characteristics of the input signals.

A further object of the present invention is to process an analog electrical input signal using variable processing parameters.

Yet another object of the present invention is to provide circuitry for operating an electronic ski binding release system wherein a release signal is generated in response to the occurrence of dangerous forces and/or moments and wherein release under non-dangerous conditions is avoided.

It is a more specific object of this invention to provide a circuit of the preceding type which effects the release of the ski binding system by processing signals having values reflecting the magnitudes and time rates of change of sensed forces and/or moments.

It is also a specific object of this invention to provide a circuit for effecting the release of a safety ski binding by processing analog electrical input signals whose values reflect the magnitudes and time rates of change of sensed forces and/or moments to obtain an output signal indicative of the cumulative effect of the forces and moments, wherein the cumulation is controlled according to preselected characteristics of the input signals.

Other objects will be apparent to those skilled in the art from the description and figures of drawings that follow and from the appended claims.

The foregoing objects are attained according to preferred embodiments of the invention by the provision of a system for converting an analog electrical input signal into an output signal having a frequency determined by characteristics of an adapting signal or signals. The number of cycles of the output signal are then counted and totalled. In a preferred embodiment, the adapting signals are derived from the input signal. In one embodiment, the frequency of the output signal is controlled by the amplitude and time rate of change or gradient of the input signal. In that embodiment, no output signal is generated in response to the portion of the input signal falling below an amplitude threshold, and when the input signal exceeds the amplitude threshold, the frequency of the output signal is varied inversely with the gradient of the input signal. The adapting signals are in one embodiment adjusted automatically from time to time based on system operation and the history of the characteristics of the input signal. In an electronic ski binding release system embodiment, the influence of the gradient of a sensed force and/or moment signal on the frequency of the output signal compensates for the skill of the skier.

In a preferred embodiment of the invention, the total number of the cycles of the output signal generated is compared to a trigger threshold. In that embodiment, a trigger signal is produced when the trigger threshold is exceeded by the number of cycles generated.

By the provision of multiplex circuitry and a counting means for each of a plurality of input signals and a timing means for synchronization, a preferred embodiment of the invention can repetitively and sequentially process each of a series of analog electrical input signals. This embodiment of the invention is appropriate for application to multiple sensor systems such as an electronic safety ski binding system having a series of transducers for measuring various forces and/or moments between the binding and a skier's leg. It is preferred in this embodiment that the voltage-to-frequency converting system control signals be derived from the sensed signals and that the adapting signals be varied over time in response to the sensed force and/or moment signals.

DETAILED DESCRIPTION OF THE PREFERRED EMBODIMENTS

Figure 1:
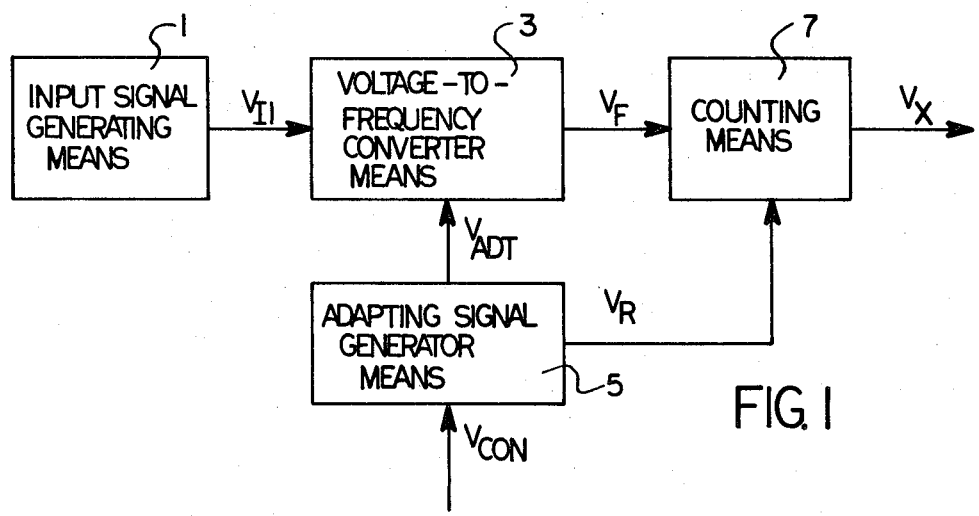
FIG. 1 is a block diagram of an analog signal processing system according to an embodiment of the invention.

Referring first to the diagram of FIG. 1, there is shown in schematic form an analog signal processing system which generates an output signal in response to an analog input signal. An intermediate processing signal whose frequency is a function of the characteristics of an adapting signal is generated and the number of cycles generated are counted. The analog input signal is generated or transmitted by an input signal generating means 1, which may incorporate amplifying means where the signal sources produce weak signals. In the environment of an electronic ski binding, means 1 could comprise sensors for generating electrical signals indicative of the magnitude and duration of forces and torques or moments. Means 1 is shown as generating an input signal $V_{I1}$, which could correspond to sensed forces or torques in an electronic ski binding. Input signal $V_{I1}$ is transmitted to a voltage-to-frequency converter means 3 ("VFC"). VFC 3 generates a frequency output signal $V_f$ in response to input signal $V_{I1}$. The frequency of signal $V_f$ is not necessarily directly proportional to the amplitude of input signal $V_{I1}$, but rather is adapted or modified by signals generated by an adapting signal generator means 5, so that converter means 3 is sometimes referred to herein as "adaptive." Adapting signal generator means 5 generates an adapting signal $V_{ADT}$ in response to a control signal $V_{CON}$, which adapts the frequency of signal $V_f$ according to some selected criteria. The frequency of signal $V_f$ may be adapted in accordance with amplitude characteristics of input signal $V_{I1}$, the characteristics including, for example, the amplitude, time rate of change, and duration and sense (positive or negative, increasing or decreasing) of the analog input signal. If $V_{ADT}$ is a function of selected amplitude characteristics of the analog input signal, that signal, $V_{I1}$, can be the control signal $V_{CON}$ to adapting signal generator means 5. $V_{ADT}$ may be a function of the characteristics of more than one analog input signal as explained hereinbelow.

Adapting signal $V_{ADT}$ need not be but one signal, but rather can comprise a plurality of signals wherefore the frequency of signal $V_f$ is a function of a plurality of parameters. Thus, as discussed in greater detail with regard to FIG. 3, $V_{ADT}$ can comprise an amplitude adapting signal $V_{AMP}$ and a time adapting signal $V_{TIME}$. Adapting signal $V_{AMP}$ can establish an amplitude threshold value which the amplitude of an analog input signal must exceed for the VFC to generate a signal $V_f$ of a non-zero frequency value. Likewise, $V_{TIME}$ can establish a frequency response of the VFC which will modify signal $V_f$ as a function of time characteristics of the input signal.

Analog input signal $V_{I1}$ can correspond in an electronic ski binding to a sensed moment or force, $V_{AMP}$ can correspond to a minimum or threshold amplitude of a sensed signal, and $V_{TIME}$ can correspond to a combined amplitude and time rate of change or gradient of a sensed signal. In a ski binding application the term "moment" to a torque, bending or twisting a skier's leg in any direction whereas the term "force" refers to linear pressure in the leg substantially perpendicular to the plane of the ski. That is, in a ski binding sensor system having front and rear force sensors, an imbalance in the sensed force signals indicates the presence of both a moment and force. Moment sensors indicate only the presence of moments. Moment and force signals are collectively referred to herein as steering signals.

$V_{ADT}$ need not be a constant value nor bear a fixed relationship to the input signal or to the $V_{CON}$ signals of the adapting signal generator means 5. Thus, when $V_{CON}$ comprises $V_{AMP}$ in an electronic ski binding system, $V_{AMP}$ can be a function of all sensed steering signals, including the skier's weight. In this application, $V_{AMP}$ is a measure of the maximum moment and/or force (modified by an appropriate factor of safety) that a skier's leg can endure without injury.

When $V_{ADT}$ comprises $V_{TIME}$, $V_{TIME}$ can advantageously incorporate the magnitude of the steering signals' rate of change or gradient. This arrangement enables control over the generation of signal $V_f$ according to the sharpness or steepness of the steering signals, the steepness varying with the proficiency of the skier. A better skier generates steeper signal gradients than a less proficient skier, to yield a larger value for $V_{TIME}$, causing the VFC to have a lower sensitivity (output frequency/input amplitude). In other words, a steering signal of sufficient magnitude to exceed any amplitude threshold must persist for a longer period of time for the proficient skier in order to generate enough cycles of frequency for a release condition to be satisfied.

The system of FIG. 1 further includes a counting means 7 for counting the number of cycles of signal $V_f$ generated, thereby comprising the cumulating function as discussed below. Adapting signal generator 5 can also be constructed to generate an output signal $V_R$ for resetting counting means 7 from time to time independently of or in response to the generation of signals $V_f$ which meet some criteria.

Counting means 7 preferably includes digital counters which accumulate the number of the cycles of output signal $V_f$ generated by VFC 3. If counting means 7 counts a prescribed number of cycles of frequency corresponding the maximum amount of stress the bone of a skier's leg has been deemed to be able to endure, a release signed $V_x$ is generated and transmitted to the release actuating mechanism of the binding.

Figure 2:
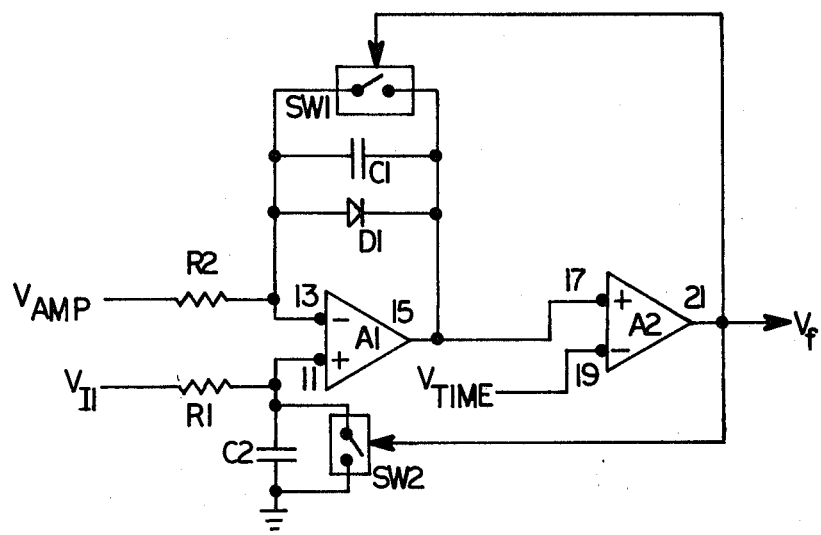
FIG. 2 is a detailed circuit of a voltage-to-frequency converter circuit which can be used with FIG. 1.

Turning next to FIG. 2, circuitry is shown for a preferred embodiment of VFC 3. The VFC of FIG. 2 includes a first enabling means in the form of a differential amplifier A1 for receiving an input signal $V_{Ii}$. $V_{Ii}$ could correspond to the magnitude of a sensed moment and/or force in an electronic ski binding. Signal $V_{Ii}$ is applied to a positive sense terminal 11 of amplifier A1 through a resistor R1. An adapting signal such as $V_{AMP}$ is applied to a negative sense terminal 13 of amplifier A1 through a resistor R2. A diode D1, a capacitor C1 and an electronic switch SW1 are connected in parallel between an output terminal 15 of amplifier A1 and input terminal 13, the anode of diode D1 being connected to terminal 13. A grounded capacitor C2 is connected to the positive sense input port 11 of amplifier A1, and an electronic switch SW2 is connected in parallel with capacitor C2. The output signal of amplifier A1 is a first output signal of the system, and it is transmitted to a positive sense input port 17 of a second enabling means in the form of a comparator A2. An adapting signal such as a gradient adapting signal $V_{TIME}$ is connected to a negative sense input port 19 of comparator A2. The output port 21 of comparator A2 is connected to switches SW1, SW2 and to a frequency counting means corresponding to counting means 7. Switches SW1 and SW2 are actuated when the amplitude of the output signal of comparator A2 substantially reaches the high or larger level of its two possible states. It is convenient, but not necessary, to select resistors R1 and R2 and capacitors C1 and C2 of equal value, respectively.

An adapting signal, such as $V_{AMP}$, applied to the negative port 13 of amplifier A1 establishes an amplitude threshold which input signal $V_{Ii}$ must exceed before amplifier A1 can produce an output signal of a non-zero frequency. (As illustrated, the VFC may only respond to positive sense input signals. If the input signal source may generate both positive and negative sense signals and it is desired to respond to both polarities, a rectifier circuit may be inserted between the signal source and input terminal 11.) Capacitors C1 and C2 cause amplifier A1 to attempt to integrate that portion of $V_{Ii}$ having an amplitude in excess of $V_{AMP}$. Diode D1 prevents the output signal of amplifier A1 from becoming negative. Thus, the portion of $V_{Ii}$ exceeding $V_{AMP}$ is integrated by amplifier A1 so that the output signal of amplifier A1 resembles a ramp function. When the integral, i.e., the output signal of amplifier A1, exceeds $V_{TIME}$, the output signal of comparator A2, $V_f$, rises from its low amplitude state to its high amplitude state. In the course of that transition, when $V_f$ reaches a predetermined amplitude it cause switches SW1 and SW2 to close momentarily and discharge capacitors C1 and C2. The integration of the portion of $V_{Ii}$ is thereby stopped and the output signal of amplifier A1 falls below $V_{TIME}$. That signal decrease below $V_{TIME}$ causes the output signal of comparator A2 to switch from its high to its low state. Therefore, $V_f$ consists of a low to high transition followed by a high to low transition, i.e. a rectangular pulse. This oscillatory process continues so long as $V_{Ii}$ exceeds $V_{AMP}$. The rate at which these pulses or oscillations are generated is the frequency of $V_f$. The time interval between the beginning of the generation of successive pulses or cycles (i.e., the period or reciprocal of the frequency) of $V_f$ is determined by the amplitude of $V_{TIME}$. A relatively high $V_{TIME}$ requires a relatively longer integration of the portion of $V_{Ii}$ before $V_{TIME}$ is exceeded by the output signal of amplifier A1 and a cycle begins. That is, a relatively low frequency results. By contrast, a relatively low $V_{TIME}$ causes a relatively high frequency $V_f$ to be generated because the output signal of comparator A2 switches to its high state after a short period of integration.

In an electronic ski binding, $V_{AMP}$ is preferably established in response to selected amplitude characteristics of the steering signals. $V_{TIME}$ is preferably established according to selected amplitude and time rate of change characteristics of the steering signals indicative in part of skier proficiency. Both $V_{AMP}$ and $V_{TIME}$ are established at levels to assure release of the binding only in danger situations.

The frequency of any output signals generated by the VFC of FIG. 2 can be assumed to have cycles whose periods are very short relative to the duration of the analog input signal. When the VFC is incorporated in an electronic ski binding where $V_{Ii}$ is reflective of the value of sensed moments and/or forces, the output signal cycle durations are very small relative to the duration of the respective moments or force signals. Moreover, differences in duration between successive cycles are relatively small. With the foregoing in mind, the frequency of the output signal at terminal 21 of amplifier A2 can be expressed as follows:

$$f = \frac{V_{Ii} - V_{AMP}}{V_{TIME}RC} = \frac{V_{IN}}{V_{TIME}\tau} \text{ when } V_{Ii} > V_{AMP} \text{ and}$$

$$f = 0 \text{ when } V_{Ii} \leq V_{AMP}$$

where
f = frequency in hertz;
$V_{AMP}$ = an adapting signal which may correspond to a moment or force control signal where the VFC is in an electronic ski binding, in volts;
$V_{Ii}$ = an input signal to the VFC, which can indicate the value of sensed moments and/or forces in a ski binding application, in volts;
$V_{TIME}$ = an adapting signal, which may correspond in an electronic ski binding to a combined steering and gradient adapting signal, in volts; and
$\tau$ = RC = time constant for the VFC, in seconds.

When the adapting signals, such as $V_{AMP}$ and $V_{TIME}$, are constant and are applied to the VFC embodiment shown in FIG. 2, the frequency of the output signal of the VFC is directly proportional to the difference between input signal $V_{Ii}$, and adapting signal $V_{AMP}$.

Figure 3:
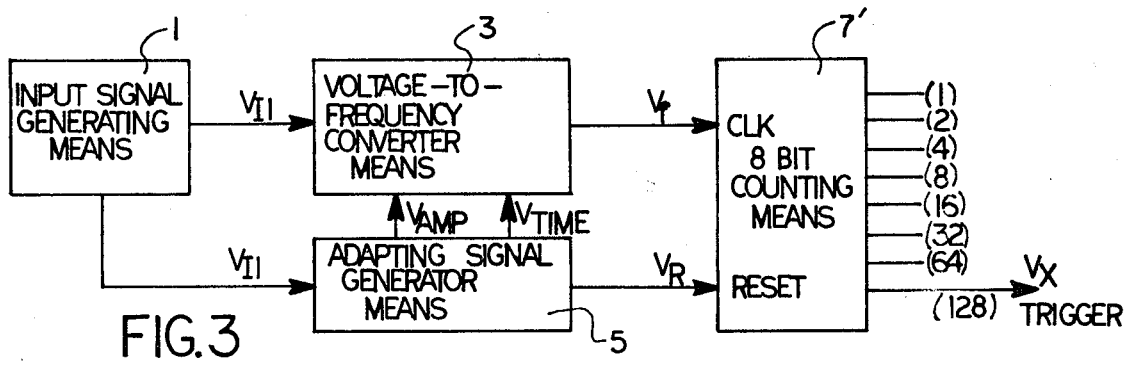
FIG. 3 is a block diagram of an embodiment of an analog signal processing system.

In FIG. 3, another embodiment of the analog signal processing system of FIG. 1 is illustrated. In this embodiment, the input signal $V_{Ii}$ from input signal generating means 1 is transmitted to VFC 3 and to adapting signal generator means 5. Generator means 5 produces adapting signals $V_{AMP}$ and $V_{TIME}$ which adapt the response of VFC 3. In this embodiment counting means 7 is an eight bit digital counter 7' which counts the cycles of output signal $V_f$ appearing at an input terminal designated CLK. Counter 7' has eight output ports at each of which a signal appears for each $2^n$ cycles of $V_f$ where n is the number, from 0 to 7, of the output port. Whenever a reset signal $V_R$ from generator means 5 is applied to an input terminal RESET of counter 7', the signals at all the output ports are set to their zero state. That is, an output signal appears at port 2 for every 4th cycle of $V_f$, at port 6 for each 64th cycle of $V_f$, and at port 7 for each 128th cycle of $V_f$, counting from the most recent application of reset signal $V_R$. When 128 cycles of $V_f$ have appeared at counter input port CLK without an intervening reset signal, a signal, the trigger signal $V_x$ appears at output port 7 of counter 7'. In an electronic ski binding, that trigger signal is used to actuate the release mechanism of the binding.

Figure 4:
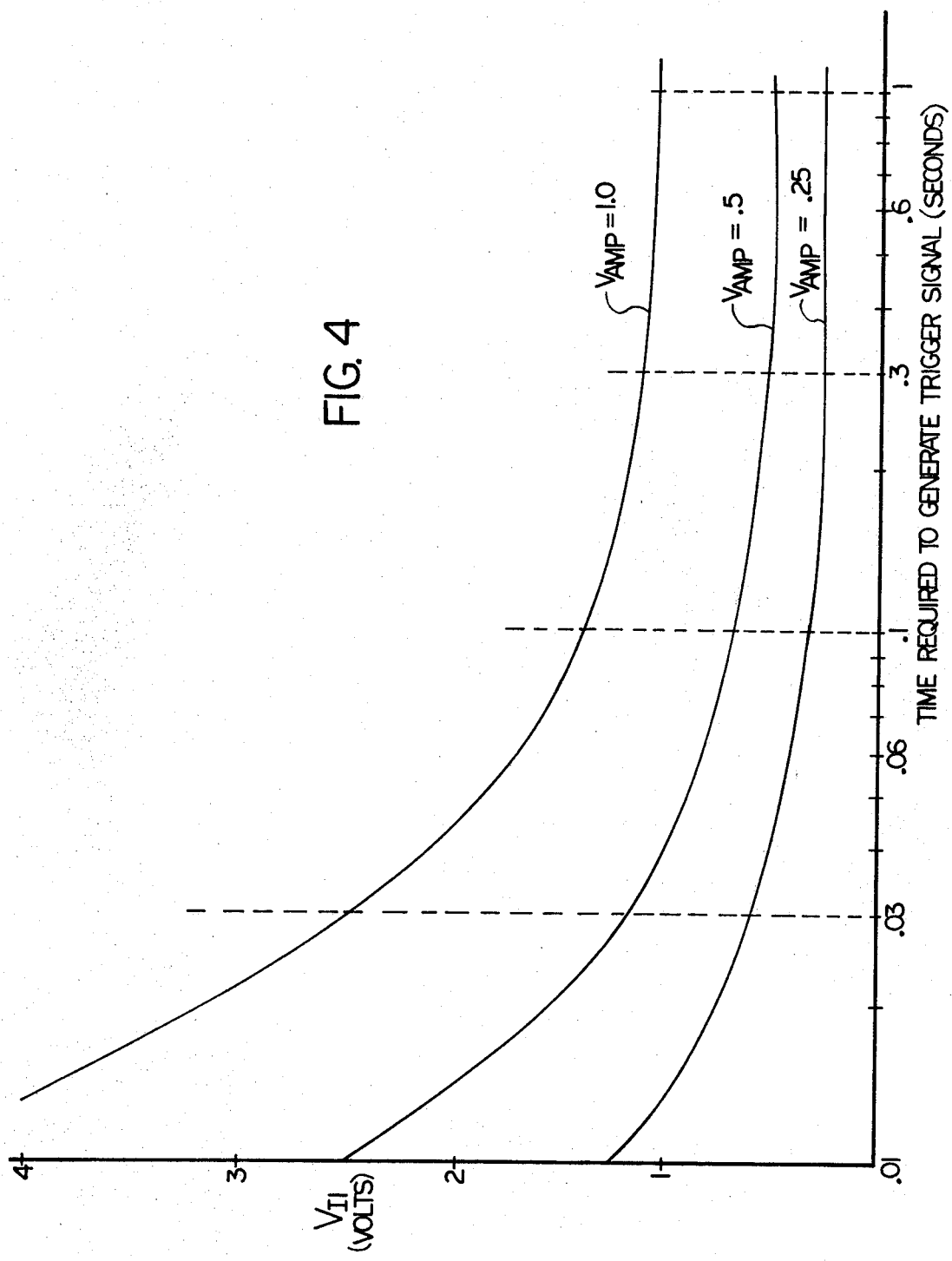
FIG. 4 is a graphical illustration of an analog signal processing system response time for various input signal strengths and adapting signal levels.

To illustrate further, the response of the system of FIG. 3 is depicted in FIG. 4 for a simple sensor signal situation. The VFC is the circuit shown in FIG. 2 and the adapting signals are set equal to each other for purposes of this example. The time for generation of the signal at port 7 of counter 7' is then just 128 times the period (reciprocal of the frequency) of $V_f$. In these circumstances, the response curves of the type shown in FIG. 4 are produced. As will be noted from an inspection of the curves, the greater the difference between the amplitude of the sensed or input signal and the adapting signal, the more quickly the trigger signal at port 7 is generated. In other embodiments, especially where the adapting signals are influenced by the history and rates of change of the sensed signals, the response time will vary in a more complex manner.

Figure 5:
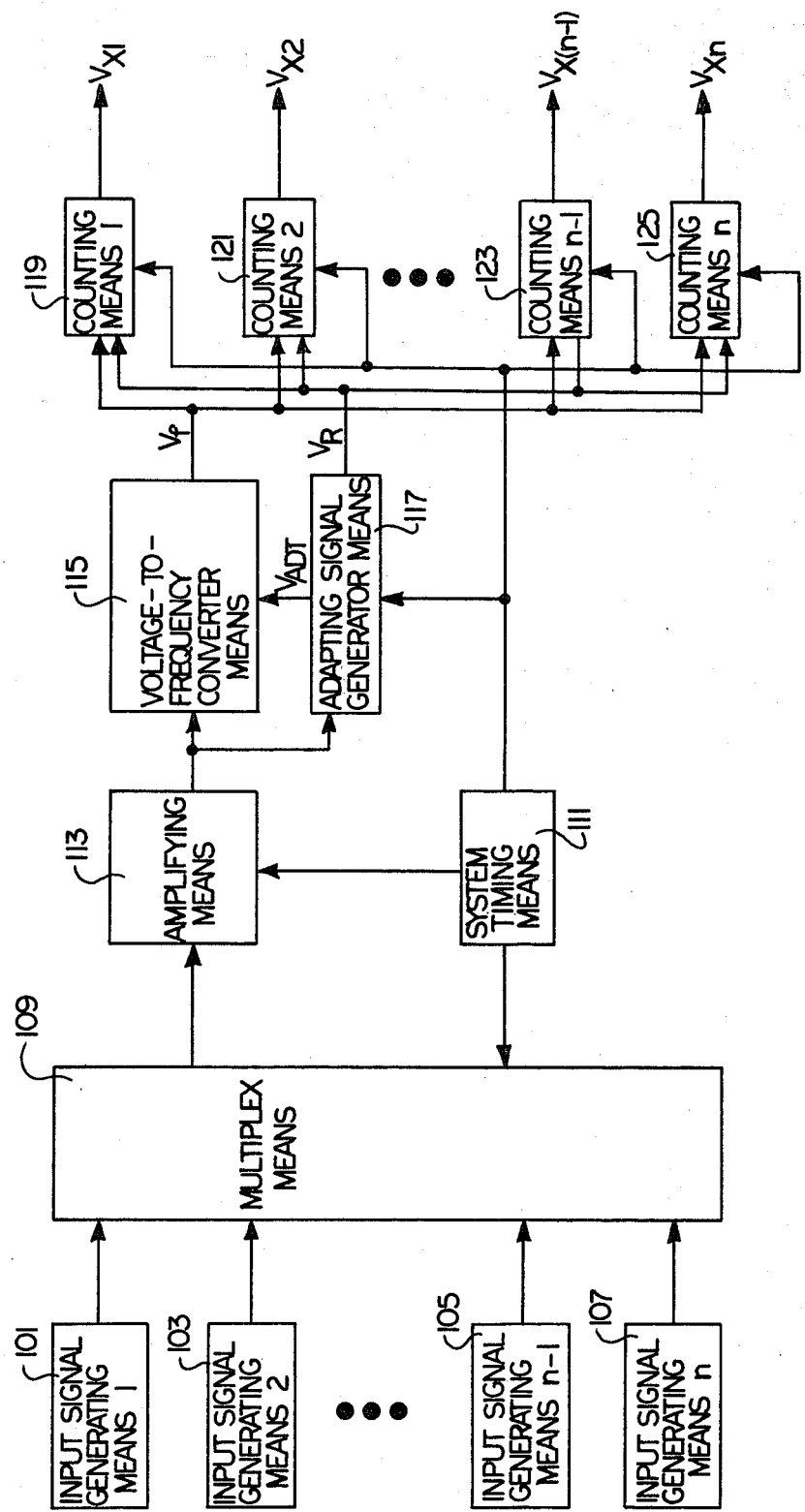
FIG. 5 is a block diagram of a multiple channel signal processing system according to an embodiment of the invention.

In many applications it is desirable to use the VFC system with a series of input signals. Employment of multiple systems in parallel as shown in FIG. 1 is undesirable in most applications because of excessive cost and power consumption. In FIG. 5 a block diagram of a VFC system for processing multiple input signals with the use of a single VFC is shown. Input signal generating means 1, 2, . . . n−1, n, numbered 101, 103, 105 and 107, respectively, produce input electrical signals in response to various stimuli. Each of these signals is applied to a multiplex means 109 which is controlled by a system timing means 111 which may be part of multiplex means 109. Multiplex means 109 in cooperation with timing means 111 connects each of the signal generating means, one at a time, to an amplifying means 113. Each signal generating means, 101 through 107 is thus connected to amplifying means 113 in a repetitive sequence so that only one of the input signals reaches amplifying means 113 at a time. (Amplifying means 113 may incorporate a rectifying means if both positive and negative input signals are generated and it is desired to respond to both). The amplified input signal is then transmitted to a VFC 115 and an adapting signal generator means 117. VFC 115 and control signal generator means 117 are as previously described in connection with FIG. 1 except that each is synchronized with multiplex means 109 by timing means 111 to coordinate its operation with the transmission of each input signal. In FIG. 5 adapting signal generator means 117 is shown controlled by the input signal transmitted by amplifying means 113. However, as discussed earlier, the signal or signals in response to which $V_{ADT}$ is generated need not be an input signal or signals. It may also be desirable for $V_{ADT}$ to be generated in response to all the sensed signals, rather than only in response to the signal being transmitted at any particular time. In this latter case, FIG. 5 would be modified by removing the connections to generator means 117 from amplifying means 113 and timing means 111, and substituting connections from signal generating means 101, 103, 105 and 107 directly to generator means 117.

The synchronization of adapting signal generator means 117 with system timing means 111 permits the switching within signal generator means 117 of circuit elements so that $V_{ADT}$ may, if desired, be made to depend upon which input signal is being transmitted. That is, a separate $V_{ADT}$, either fixed or variable, may be established not only in response to characteristics of the transmitted input signal, but also in response to which signal is being transmitted. Likewise, the switching from one channel to another permits the use in different signal channels of different components, such as resistor R1 in the embodiment of the VFC as shown in FIG. 2. By using different channel-related components, the time constant and response of the VFC can be different for different input signals.

The counting means 1, 2, . . . n−1, n, numbered 119, 121, 123, 125, respectively, are connected to receive the output signals $V_f$ of VFC 115. Each counting means is also connected to timing means 111 for synchronous actuation so that counting means 119 is active while signal generating means 101 is connected to VFC 115, counting means 121 is active while signal generating means 103 is connected, and so forth. Thus, a separate counting means accumulates the number of cycles generated by the VFC in response to each separate input signal. Counting means 119, 121, 123 and 125 generate output signals $V_{x1}$; $V_{x2}$, . . . $V_{x(n−1)}$, $V_{xn}$, respectively. Adapting signal generator means 117 can generate resetting signals for resetting the counters after the latter have generated their respective output signals.

Figure 6:
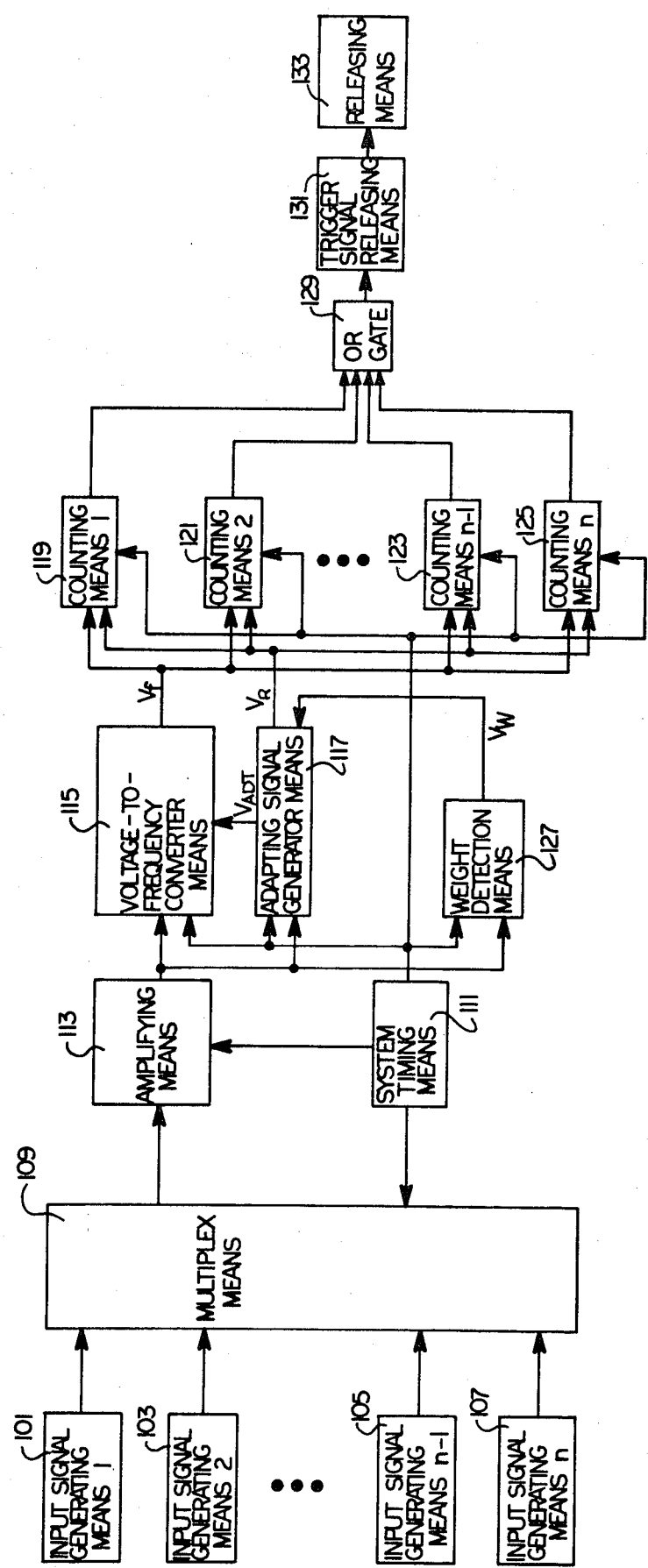
FIG. 6 is a block diagram of a multiple channel analog signal processing system having a weight detection means and a trigger signal output device.

FIG. 6 shows a modified version of the block diagram of FIG. 5, including additional functions useful for numerous applications of the multiple channel VFC including use as part of an electronic ski binding. In the electronic ski binding application, a weight detection network 127 receives the transmitted signal from amplifying means 113 and the timing signal from means 111 for use in measuring the weight of the skier. Network 127 generates a weight signal $V_w$ which, in turn, is supplied to control signal generator 117 for an appropriate initial adjustment to $V_{ADT}$. Thus, when the weight detection network is employed, the range of values permitted by $v_{ADT}$ is predetermined by the weight of the skier; and any adjustments made by $V_{ADT}$ by way of input signal amplitude and/or gradient characteristics as discussed below, will have predetermined upper and lower limits defined by the weight of the skier. (As explained earlier for generator means 117, network 127 may selectively be connected directly into those input signal generating means capable of weighing the skier. In that case, network 127 would not require connections to amplifying means 113 or timing means 111, but would require connections to input means 101, 103, 105 and 107.) One of the four input terminals of an OR gate 129 is connected to each of the output of terminals of counting means 119, 121, 123 and 125. If any one of the counting means produces an output signal level $V_x$ indicating that an injury is imminent, OR gate 129 is enabled to cause a trigger signal generating means 131 to generate a trigger signal to which a releasing means 133 responds by placing the binding in the releasing condition.

Figure 7:
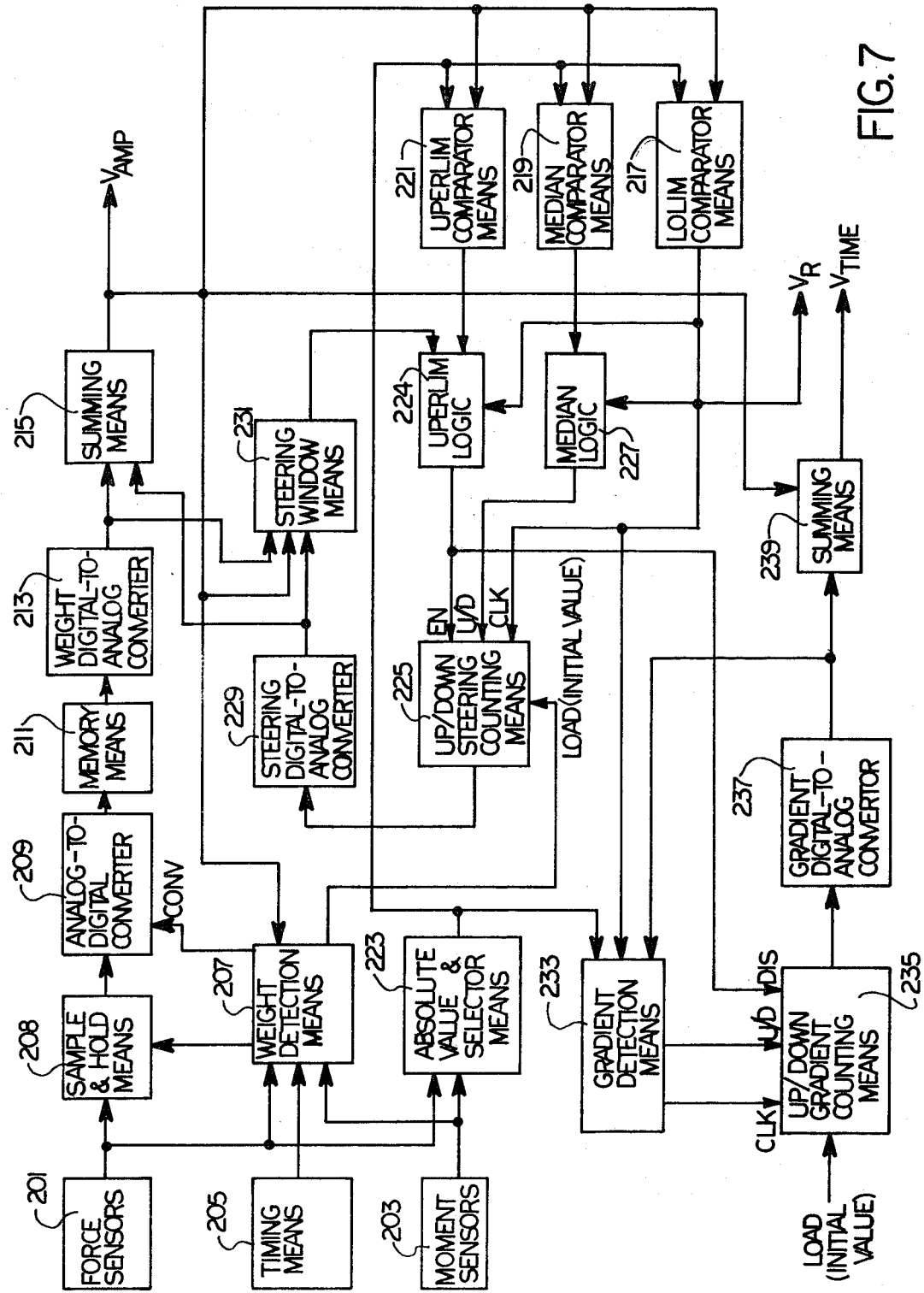
FIG. 7 is a block diagram of an adapting signal generator and weight detection system for use with the systems shown in FIGS. 3 and 6.
Figure 8A:
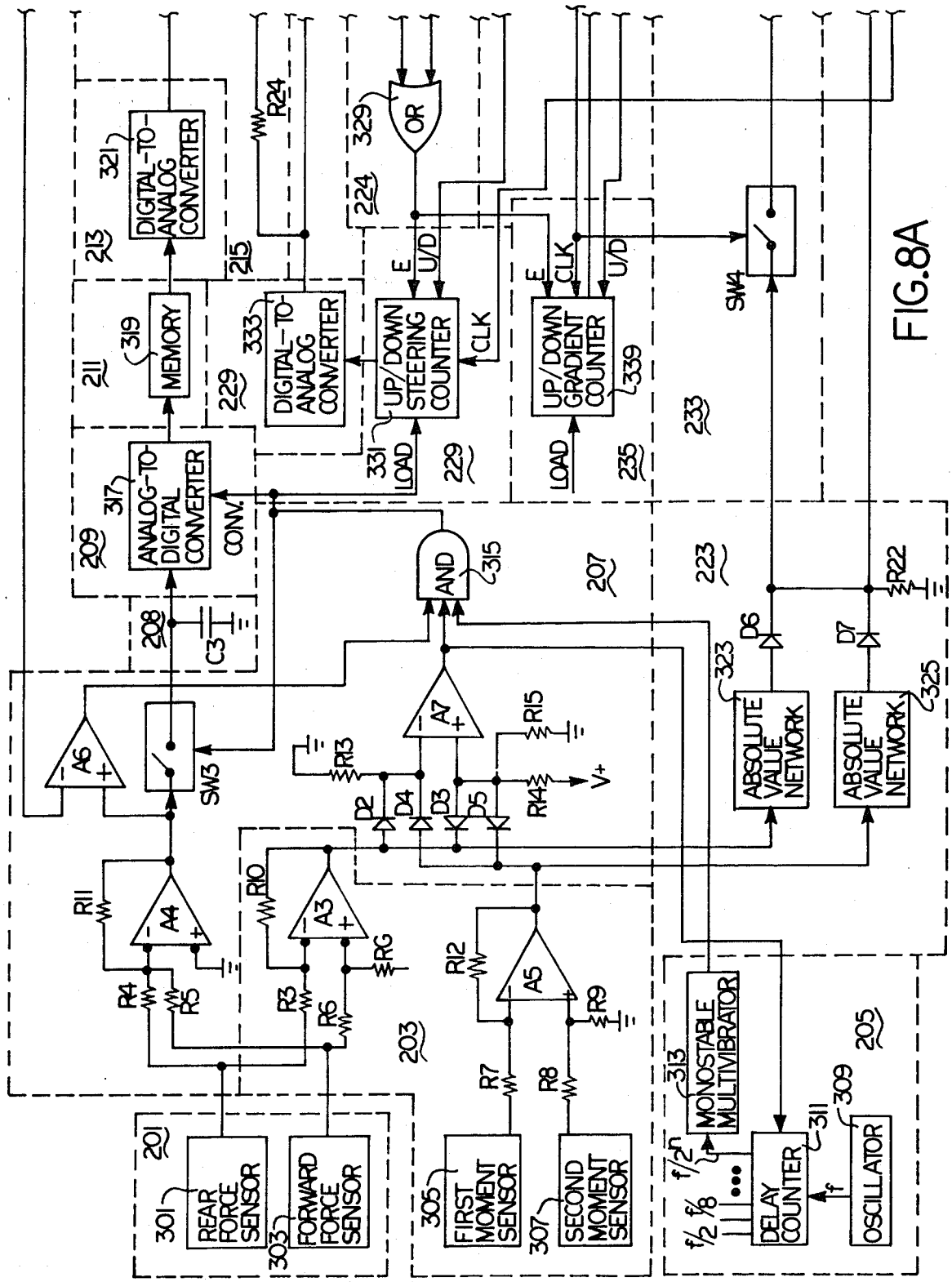
FIG. 8 which consists of FIGS. 8A and 8B, is a detailed circuit diagram which can be used for the generator and weight detection system shown in FIG. 7.

Turning now to FIGS. 7 and 8, diagrams of an embodiment of a combined weight detection network and adapting signal generator means such as are depicted in the diagram of FIG. 6 are shown. The network and generator of FIGS. 7 and 8 are particularly useful in application to an electronic ski binding and the following discussion is directed to that application without excluding other applications where the detected stimuli may or may not be forces and moments. In FIGS. 7 and 8 and the discussion that follows, it is assumed that a ski binding is fitted with sensors that are capable of separately detecting forces and moments. The weight detection and compensation function measures a skier's weight only when the force sensors detect a downward force in the substantial absence of the detection by any sensors of any moments for a selected length of time. A new measured weight replaces the weight value formerly stored in the generator only if it exceeds the former value. The stored weight value affects the adapting signals to account for a skier's weight. The adapting signal generator of FIG. 7, upon detection of steering signals, functions to modify continually the adapting signals which control the operation of the VFC. Adapting signal modifications are based on the history of the signals generated in an on-going ski run. Modifications are possible only when at least one steering signal amplitude falls within a "window" extending above and below a median signal level (MEDIAN). Steering signals exceeding the upper limit (UPERLIM) of the window may indicate danger situations and signals below the lower limit (LOLIM) of the window are of no interest. Therefore, no adapting signal adjustments are made if the amplitude of any steering signal exceeds UPERLIM or if none of the amplitudes of the steering signals exceeds LOLIM. When the steering signals' strengths fall within the window, adjustments of the adapting signals up or down are made depending upon whether MEDIAN is exceeded or not, respectively. To avoid interference with the measurement of potentially significant sensor or input signals, adapting signal modifications are made only after the amplitudes of the steering signals fall below LOLIM. At that same time, it is preferable to reset the counting means of FIG. 5 to zero to avoid an accumulation of counts during a ski run which do not in themselves represent a danger condition. Adapting signal modifications based on input signal gradients are made, if at all, at a substantially fixed time after the amplitude of the steering signals exceeds LOLIM.

In FIG. 7 a block diagram of circuit functions is shown, each functional block being numbered. In FIG. 8, more detailed circuitry to accomplish the functions is shown divided into blocks numbered to correspond with the numbering of FIG. 7. The sensors corresponding to the input signal generating means of FIG. 5 are divided into a group of force sensors 201 and a group of moment sensors 203. A second system timing means 205 is provided, which is preferably part, in a ski binding application, of system timing means 111 shown in the diagram of FIG. 5.

The steering signals produced by sensors 201 and 203 and the then existing amplitude adapting signal are supplied to a weight detection means 207 which determines whether the appropriate conditions (all forces pushing on the ski binding, moments insignificant, no change in the sensor signals for a preselected time and the measured weight exceeds the existing stored weight value) exist for measuring the weight of the skier. The preselected time, measured through a timing means 205, during which the weight measuring conditions must be stable may typically range from 1 to 3 seconds. If those conditions are fulfilled, weight detection means 207 commands a sample and hold means 208 to store the new weight value and commands an analog-to-digital signal converter 209 through a converter terminal CONV to convert the sampled analog weight signal into a digital signal. Preferably, converter 209 comprises an electronic counter or register following a voltage-to-frequency converter of the type shown in FIG. 2, but without an adapting signal generator. Preferably, when the circuitry of FIG. 7 is used with the systems shown in FIGS. 2 and 5, VFC 113 can be used for the analog-to-digital signal converter by temporarily grounding its input resistor R2 going to terminal 13 and connecting terminal 19 to a predetermined stable reference voltage. Once the conversion takes place, the VFC can be restored to its principal function. The output signal of converter 209 (whether from the VFC or a conventional analog-to-digital converter) is stored in digital form in a connected memory or latch means 211. Storage of the measured weight in digital form assures stable long-term storage, but a digital-to-analog weight signal converter 213 connected to memory means 211 permits use of the stored weight value in subsequent analog signal processing circuitry.

The analog stored weight value from converter 213 is applied to one of two input terminals of a summing means 215. The other input signal to summing means 215 is a stored steering signal value which may be an initial value generated when power is first applied to the circuit or a value generated during operation of the circuit, as is discussed further hereinbelow. The output signal of summing means 215 is a combined weight and steering amplitude adapting signal. This amplitude adapting signal corresponds to adapting signal $V_{AMP}$ as discussed in connection with FIG. 2. In FIG. 2, $V_{AMP}$ is applied to terminal 13 of differential amplifier A1 through resistor R2. When $V_{AMP}$ is exceeded by the amplitude of the steering signals, amplifier A1 generates an output signal with an non-zero frequency which is applied to terminal 17 of comparator A2 as previously described.

In order to determine whether or not a steering signal level falls within the window for adjusting the adapting signals, a portion of the output signal of summing means 215 is transmitted to the same sense input terminals of each of three comparator means, a first actuating means in the form of a LOLIM comparator means 217, a MEDIAN comparator means 219 and an UPERLIM comparator means 221, which together form a window establishing means. A successively smaller portion of the amplitude adapting signal is applied to each of comparator means 221, 219 and 217, respectively. The other sense input terminals of each of comparator means 217, 219 and 221, receive the output signal of an absolute value and selector means 223. Means 223 receives the input signals from sensors 201 and 203, rectifies them and selects the one with greatest amplitude for application to the three comparator means. If the steering signal from means 223 exceeds the portion of the amplitude adapting signal applied to UPERLIM comparator means 221, the output signal of comparator means 221 switches to its high state. Comparator means 221 is connected to a disabling means in the form of an UPERLIM logic circuit 224 which, in turn, is connected to an enabling terminal EN of a first initializing means in the form of an up/down steering counting means 225. Up/down counting means 225 has the ability to retain a digital word or number in digital form which may be increased or decreased according to the signals presented at its various terminals. Counting means 225 has the additional ability to store or to have loaded into it a digital word representing an initial value. In the embodiment of FIG. 7, the initial value is loaded whenever power is first applied to the circuit and, through a connection to means 207, whenever a weight measurement is taken. Counting means 225 thus stores an amplitude adapting signal value, either an initial value, or the on-going value as the initial value is adjusted up and down based on the history of a ski run. When the output signal of UPERLIM comparator means 221 is relatively high, logic circuit 224 places a relatively high signal on enabling terminal EN disabling counting means 225 from counting up or down. That is, when the steering signal from means 223 exceeds the limits of the adjustment window, the adjustment circuit of the adapting signal generator cannot react. When the steering signal from means 223 exceeds the portion of the amplitude adapting signal applied to MEDIAN comparator means 219, but not the portion applied to comparator means 221, the output signal of comparator means 221 is relatively low and (provided $V_{AMP}$ is within permitted limits as discussed below) logic 224 enables counting means 225 to respond to the signals present at its other input terminals. In this situation, the output signal of comparator means 219 is relatively high and is applied to an enabling means in the form of a MEDIAN logic circuit 227. The output signal of logic circuit 227 is applied to a U/D input terminal of counting means 225. A high level signal to the U/D terminal of counting means 225 causes the stored word to be increased the next time the signal at a CLK input terminal of counting means 225 switches from a high state to a low state. Terminal CLK is connected directly to the output terminal of LOLIM comparator means 217 so that whenever the sensor signal from means 223 decreases below the portion of the amplitude adapting signal applied to comparator means 217 causing the output signal of means 217 to fall to a low state, the value stored in counting means 225 will be increased. Likewise, if the steering signal from means 223 is such that the portion applied to MEDIAN comparator means 219 does not cause its output to switch into its high state, but causes the output signal of LOLIM comparator means 217 to switch to its high state, the value stored in counting means 225 will be reduced when the output of LOLIM comparator 217 falls to its relatively low state. No response of any sort is produced if the steering signal from means 223 does not exceed the portion of the amplitude adapting signal applied to comparator means 217. The output signal of comparator means 217 also provides reset signals to clear logic 224 and 227 and which may also reset to zero the counting means which accumulate the cycles generated by the VFC. Resetting may therefore be timed to occur at the beginning or end of an interval defined by two successive transitions of the output signal of comparator means 217.

In the manner just described, the value stored in counting means 225 rises, falls or is left unchanged at the ends of time intervals defined by the switching of the output of comparator means 217 from a high state to a low state according to whether sensor signals are relatively large, intermediate or small. Thus, counting means 225 includes adjustment means for adjusting the amplitude of an output signal such as $V_{AMP}$ and of upper and lower portions thereof according to the amplitude of analog input signals, which are in this case steering signals. The digital word stored in counting means 225 is converted to an analog signal by steering digital-to-analog signal converter 229 and applied to the second input terminal of summing means 215. As described before, the output signal of summing means 215 is just the amplitude adapting signal. To avoid any possibility that the amplitude adapting signal thus generated would fall so low that a binding releasing trigger signal could be generated in the absence of any reasonable probability of danger, the range of possible amplitude adapting signal values is limited to upper and lower bounds established by an inhibiting means in the form of a first signal or $V_{AMP}$ limiting means 231. Limiting means 231 receives at its input terminals the output signals of steering signal converter 229 and weight signal converter 213, and the amplitude adapting signal $V_{AMP}$. The output signal of limiting means 231 passes through UPERLIM logic 224 to terminal EN of counting means 225. If limiting means 231 determines that one of its limits or bounds has been reached, it inhibits adjustment of the amplitude adapting signal beyond that limit by causing logic 224 to place a relatively high signal on the EN terminal counting means 225. The inhibition continues until the amplitude adapting signal is changed to a value within the limits established by means 231.

In a similar fashion, an adapting signal incorporating a steering signal gradient component is generated. A gradient measuring or detection means 233 receives the larger of the absolute value of the sensor signals from selector means 223 and the output signal of comparator means 217. When a steering signal causes the output signal of LOLIM comparator means 217 to change from its low state to its high state, gradient detection means 233 is triggered and samples the sensor signal gradient. Means 233 compares a previously stored gradient value (which may be an initial value generated when power is first applied to the circuit or a value produced by adjustment of that initial value based on the history of a ski run) with the newly sampled gradient. If the newly sampled gradient is larger or smaller than the stored value, means 233 generates a relatively high or low output signal, respectively. This output signal is transmitted to a U/D port of a second adjustment means in the form of up/down gradient counting means 235, a high signal setting up an increment, a low signal setting up a decrement, of the stored gradient value. Gradient detection means 233 also functions as an actuating means for actuating counting means 235. A CLK port of counting means 235 is triggered at the end of the gradient sampling period permitting the up or down change in the stored value to take place. A DIS input terminal of counting means 235 is connected to the EN terminal of counting means 225 so that both counting means are similarly disabled from changing their stored values for an interval in which a very large steering signal occurs, but allowing counting means 235 to operate otherwise. Thus, counting means 235 functions as an initializing means for establishing an initial amplitude of an output signal such as $V_{TIME}$, and as an adjustment means for adjusting the amplitude of the output signal. The digital gradient value stored in counting means 235 is transmitted to and converted to an analog signal in a gradient digital-to-analog signal converter 237. That analog gradient value is fed back to detection means 233 for the comparison that is made therein from time to time. Finally, the analog gradient value generated as described in added to the amplitude adapting signal in a summing means 239 to produce at its output a combined adapting signal which corresponds to $V_{TIME}$ of FIG. 2. In FIG. 2, $V_{TIME}$ is applied to terminal 19 of comparator A2. When the output signal of amplifier A1 exceeds $V_{TIME}$, comparator A2 (and VFC 3) generates a cycle or pulse as previously described. An increase in $V_{TIME}$ caused by an increase in the gradient, indicating a relatively skilled skier, delays the generation of the cycle, i.e., spreads the separation of the cycles, decreasing the frequency of $V_f$ as explained before. Likewise, a decrease in $V_{TIME}$ increases the frequency of $V_f$.

Passing to the detailed circuit diagram of FIG. 8, a schematic diagram of the embodiment of an adapting signal generator and weight detection network of FIG. 7 is shown. The force sensors 201 of FIG. 7 comprise in FIG. 8 a rear force sensor 301 and a forward force sensor 303. It is reiterated that the two force sensors, the rear or heel sensor and the forward or toe sensor detect a moment when their respective force signals are unequal, whereas the moment sensors detect moments only. Moment sensors 203 comprise a first moment sensor 305 and a second moment sensor 307. That is, the circuit of FIG. 8 shows four sensor modules, but the number of sensors may be increased or decreased within the spirit of the invention with appropriate changes to the circuitry. Timing means 205 comprises an oscillator 309 connected to a delay counter 311 which is connected to trigger a monostable multivibrator 313. The signal from rear sensor 301 is applied through a resistor R3 to the negative sense terminal of a differential amplifier A3 and through a load resistor R4 to the negative sense terminal of a summing amplifier A4 which has a grounded positive sense terminal. The signal from forward sensor 303 is applied through a resistor R5 to the negative sense terminal of amplifier A4 and through a load resistor R6, to the positive sense terminal of amplifier A3, which is grounded through a resistor RG. The signals from moment sensors 305 and 307 are connected through load resistors R7 and R8, respectively, to the negative and positive sense terminals, respectively, of a differential amplifier A5. The positive sense terminal of A5 is grounded through resistor R9. Each of A3, A4 and A5 have feedback resistors R10, R11 and R12, respectively, connected from their output terminals to their negative sense input terminals.

The output signals of amplifiers A3, A4 and A5 are used in determining whether the conditions for taking a weight measurement are satisfied. If the signals from both force sensors indicate the presence of a downward force (negative sense electrical signals in the embodiment of FIG. 8), the signals add at the negative sense input terminal of amplifier A4 making the output signal of amplifier A4 relatively high. That output signal is transmitted to the positive sense terminal of a comparator A6, the existing amplitude adapting signal, $V_{AMP}$, being applied to the negative sense terminal of comparator A6. If the output signal of amplifier A4 is relatively large and if it exceeds the existing $V_{AMP}$, two of the conditions for taking a weight measurement are satisfied and the output signal of comparator A6 assumes its high state. The output signal of comparator A6 is connected to the first of three input terminals of an AND gate 315.

The output signals of amplifiers A3 and A5 are applied to a network of diodes and a comparator to determine if (a) the moment signals produced by moment sensors 305 and 307 and (b) the moment indicated by the difference between the forward and rear sensor signals, are sufficiently small to satisfy the conditions for measuring weight. The output signal of amplifier A3 is connected both to the anode of a diode D2, whose cathode is connected to the negative sense terminal of a comparator A7, and to the cathode of a diode D3, the anode which is connected to the positive sense terminal of comparator A7. The output signal of amplifier A5 is connected both to the anode of a diode D4, the cathode of which is connected to the negative sense terminal of comparator A7, and to the cathode of a diode D5, the anode of which is connected to the positive sense terminal of comparator A7. The negative sense terminal of comparator A7 is grounded through a resistor R13 and the positive sense terminal of comparator A7 is connected to a positive voltage source through a resistor R14 and to ground through a resistor R15. The output signal of comparator A7 is high when the output signals of amplifiers A3 and A5 are within positive and negative voltage limits established by the forward voltage drops of diodes D2, D3, D4 and D5. Resistors R13, R14 and R15 assure a non-floating input condition for A7 if none of the diodes is forced into the conducting state by the outputs of amplifiers A3 and A5. A positive voltage on resistor R14 causes comparator A7 to be in a high state for outputs of amplifiers A3 and A5 lower than the foregoing voltage drops of the diodes. The output signal of comparator A7 is connected to the second input terminal of AND gate 315. When the output signal of comparator A7 is high, another of the weight measuring conditions is satisfied.

The final condition for weight measurement is the stability of downward forces and insignificant moments for a preselected period. The output signal of comparator A7 is connected to the initiating input terminal of delay counter 311. Counter 311 then begins to count cycles from oscillator 309. The series of output terminals of counter 311 go high in a binary fashion as oscillator 309 produces cycles of frequency. By choosing the frequency of oscillator 309 and one of the output terminals of counter 311, a delay of the desired duration between the output signal of comparator A7 going high and the generation of an output signal by counter 311 is obtained. The output signal from counter 311 triggers monostable multivibrator 313 which then generates a pulse of duration T1. That pulse is applied to the third input terminal of AND gate 315. Thus, if all the conditions for measuring weight are satisfied, that is, if the signals on all three input terminals of AND gate 315 are in their high state at once, the output signal of gate 315 goes high for T1 and weight is measured. The duration of the delay in counter 311 determines the time during which the force and moment signals must have the proper stable relationship in order that a weight measurement may be made. (It is to be noted that the circuit of FIG. 8 is arranged for a particular polarity of steering signals; if the polarities of the signals are different, appropriate polarity changes in the circuits will have to be made to achieve proper operation.)

When the output signal of gate 315 goes high indicating satisfaction of weight measurement conditions, that output signal closes a switch SW3 for time T1. Closed switch SW3 connects the output signal of summing amplifier A4, the sum of the force signals, to a sample and hold device, comprising a grounded capacitor C3, for transmission to the input terminal of an analog-to-digital signal converter 317. The output of the AND gate is also transmitted to a terminal CONV of converter 317. The end of interval T1, indicated by the output of AND gate 315 dropping from a high to a low state, triggers converter 317 through its CONV terminal and initiates the conversion. (It will be recalled that preferably the VFC may be used with an associated counter as converter 317. In that case the high level signal from gate 315, also causes the VFC to be switched to its non-adaptive converter mode for the duration of the conversion cycle.) Capacitor C3 charges for time T1 to a voltage corresponding to the new weight value and that value is converted into a digital signal by converter 317. The digital output signal of converter 317 is forwarded to a memory or latch 319 for storage. As noted earlier, it is desired to store values in digital form for stability, but simpler to process analog signals. The digital value stored in latch 319 is converted back into an analog signal by a digital-to-analog signal converter 321 and is applied through an input resistor R16 to the negative sense input terminal of a summing amplifier A8 which has a feedback resistor R17 connected from its output terminal to its negative sense input terminal. The positive sense input terminal amplifier of A8 is grounded. The output signal of amplifier A8 corresponds to adapting signal $V_{AMP}$ as previously discussed.

Adapting signal $V_{AMP}$ is applied to a voltage divider comprising resistors R19, R20 and R21 connected in series, R21 being grounded. The junctions of R18 and R19, R19 and R20, and R20 and R21 are connected to the negative sense input terminals of comparators A9, A10, A11, respectively. The positive sense terminals of the comparators are connected to the large of the absolute values of the output signals of differential amplifiers A3 and A5. The output signal of amplifier A3 is connected to an absolute value network 323, which rectifies the signal, if necessary, the rectified signal being applied to the anode of a diode D6. The output signal of amplifier A5 is connected to an absolute value network 325, which rectifies the signal, if necessary, the rectified signal being applied to the anode of a diode D7. The cathodes of D6 and D7 are connected together, through a resistor R22 to ground and to the positive sense input terminals of comparators A9, A10 and A11. Comparator A9 comprises the UPERLIM circuit discussed earlier. The output signal of comparator A9 is transmitted to a latch 327, the latch output being connected to one of two input terminals of an OR gate 329. The output of OR gate 329 is connected to an enable terminal E of an up/down steering counter 331. When a high level signal is present at terminal E, counter 331, which retains a stored value, is incapable of changing that value. A low level signal at terminal E permits counter 331 to change or maintain the same value stored in it according to the states of the signals at its other input terminals. When the absolute value of the steering signal applied to the positive sense terminal of comparator A9 exceeds the portion of $V_{AMP}$ applied to the negative sense terminal, the output signal of comparator A9 assumes its high state. In response, latch 327 adopts, and maintains until cleared, a high level output signal inhibiting counter 331 through gate 329. That is, as previously discussed, a "locking" of counter 331 occurs when steering signals exceed the window for adapting signal adjustment. When the steering signals cause the output signal of comparator A9 to be low, counter 331 is not inhibited by comparator A9. Likewise, if the absolute value of the larger of the output signals of amplifiers A3 and A5 exceeds the portion of $V_{AMP}$ applied to the negative sense terminal of comparator A10, which comprises the MEDIAN circuit discussed earlier, the output signal of comparator A10 is relatively high. This output signal is transmitted to a second latch 332, which retains, until cleared, that level, the output signal of latch 332 being connected to an input terminal U/D of counter 331. A high level signal at terminal U/D prepares the counter to count up or to increase the digital word stored in it. A low level signal at terminal U/D prepares the counter to count down or decrease the digital word stored in it. The actual change in the stored word is not made until a counter terminal CLK receives a signal transition from a high to a low state. Counter 331 has an additional terminal LOAD. Upon the appearance of a high level signal at LOAD, a fixed, initial value of steering signal is loaded into counter 331, and any previously stored value is purged. The LOAD terminal receives a high signal whenever power is first applied to the circuit and, by virtue of a connection to the output of AND gate 315, whenever weight is measured. When the steering signal within the adapting signal adjustment window exceeds the MEDIAN value of the window, counter 331 prepares to increase the value of the stored steering signal value. In like manner, when the steering signal is within the window but does not exceed the MEDIAN value, the output signal of comparator A10 is in its low state so that the output signal of latch 332 is in a low state preparing counter 331 to decrease the stored word representing the measured steering signal value.

Finally, when the larger of the absolute values of the output signals from amplifier A3 and A5 exceeds the portion of $V_{AMP}$ applied to the negative input terminal of comparator A11, comprising the previously discussed LOLIM circuit, the output signal of comparator A11 switches to its high state. This output signal is transmitted to the CLK terminal of counter 331 and through series connected resistor R23 and capacitor C4 to ground. The input signal to an inverting amplifier A12 is taken from the junction of resistor R23 and capacitor C4 and the output of amplifier A12 is transmitted to a CL input terminal resetting each of latches 327 and 332. When the steering signals fall below the portion of $V_{AMP}$ applied to comparator A11, the output signal of comparator A11 drops from its high state to its low state. This high-to-low transition is transmitted to counter 331 through the CLK terminal and permits the counter to count up or down depending upon the state of the latched signal at the U/D terminal. The same amplified transition clears latches 327 and 332 with a delay imposed by resistor R23 and capacitor C4 through their CL terminals so that they are prepared for the next steering signal to be sensed. The delay is needed to be sure that counter 331 is updated before the sense or direction of the input correction signal is lost, when this circuit is used in the system of FIG. 1. Clearing latch 327 also removes any signal from one of the input terminals of OR gate 329 so that counter 331 may be enabled for the next steering signal if the other OR gate terminal does not receive a high state signal. The reset signal output terminal allows use of the transition signal as a reset signal for resetting any associated counting means such as those shown in FIGS. 1, 2, 3, 5 and 6.

The output of counter 331 is a digital word which is either the initial steering signal amplitude or that amplitude as modified by counting up and down during a preceding time when steering signals have been detected. That digital word is transmitted to a digital-to-analog signal converter 333. The analog output signal of converter 333 is transmitted through a resistor R24 to the negative sense input terminal of summing amplifier A8, which as previously explained also receives the analog weight signal. The sum of these two analog signals appears at the output terminal of amplifier A8 as $V_{AMP}$. As indicated by the preceding discussion, $V_{AMP}$ will be adjusted up and down or maintained without change over the course of receiving steering signals, but adjustments will occur only when the steering signals fall below the LOLIM limit of the adjustment window so that the output signal of comparator A11 makes a high-to-low transition. Thus the time intervals between adapting signal adjustments vary in duration depending upon the amplitudes of the steering signals. This effect is further explained below in connection with the description of FIG. 9.

Because the adapting signal $V_{AMP}$ may be varied, it might possibly under unusual circumstances rise beyond a safe value or fall to an unrealistically low value. In a ski binding application, it is necessary to limit the range of $V_{AMP}$ to safe bounds. The upper bound is a biologically safe limit to avoid injury and the lower bound is chosen to avoid unintentional binding release in a situation which is unlikely to pose a danger to anyone. To prevent $V_{AMP}$ from exceeding these bounds, the analog output signals of converters 321 and 333 and the amplitude adapting signal are applied to a $V_{AMP}$ limiting means 335. If the amplitude adapting signal is at either limit bound established by limiting means 335, the output signal of limiting means 335 switches to a high state. The output signal of limiting means 335 is transmitted to the other input terminal or OR gate 329. Thus when an amplitude adapting signal bound is reached, counter 331 is inhibited from further adapting signal adjusting activity until a new weight measurement is taken, as previously explained, or until power is removed from and then restored to the circuit.

The generation of a low-to-high signal transition at the output of comparator A11 indicating the presence of an increasing steering signal exceeding the LOLIM limit, initiates measurement by the time rate of change or gradient adapting signal adjustment circuitry. The output signal of comparator A11 is connected to a monstable multivibrator 337 which generates a pulse of duration T2 in response to the low-to-high transition. Duration 72 is chosen to be less than the minimum expected time that steering signals will exceed and remain in excess of LOLIM. The pulse produced by multivibrator 337 closes a switch SW4 for time T2 connecting the previously described larger absolute value steering signal from the cathodes of diodes D6 and D7 to a grounded capacitor C5. The signal paths from the amplifiers A3 and A5 to capacitor C5 are designed to have minimum impedance so that the electric charge collected on capacitor C5 will be representative of the average time rate of change or gradient of the selected steering signal. This measure of the gradient is applied to the positive sense terminal of a comparator A13, a signal indicating the previously stored value of the gradient being applied to the negative sense input terminal of A13. If the newly sensed gradient exceeds or is less than the stored value, the output signal of comparator A13 is relatively high, or relatively low, respectively. The output signal of comparator A13 is transmitted to a U/D terminal of an up/down gradient counter 339. Counter 339 is similar to counter 331 in that a high level signal at its U/D terminal sets the counter to count up and a low level signal at that terminal sets the counter to count down when a high-to-low signal transition appears at a CLK terminal. An initial gradient value is loaded into and stored in counter 339 when power is applied to the circuit. A high level signal applied at an enabling terminal E of counter 339 disables the counter from counting. Terminals E of counters 331 and 339 are connected together so that a steering signal exceeding the UPERLIM limit (and possibly indicating a danger situation) locks both counters against further adapting signal adjustment until after the steering signals fall below and then rise above the LOLIM limit. So long as the measured gradient is different from the stored value, counter 339 will be set to make an adjustment. The CLK terminal of counter 339 is connected to the output port of multivibrator 337 so that the adjustment in the digital gradient word is made at the end of time T2 if counter 339 has not been disabled in the interim by a very large steering signal. The digital gradient word stored in counter 339 is applied to a digital-to-analog signal converter 341, and the resulting analog signal is supplied to the negative sense terminal of comparator A13 as previously described. The gradient signal is also applied through a resistor R24 to the negative port of a summing amplifier A14. The amplitude adapting signal from the output terminal of amplifier A8 is applied through a resistor R25 to the negative sense input terminal of amplifier A14. The positive sense input terminal of A14 is grounded and a feedback resistor R26 connects the output terminal of amplifier A14 to its negative sense input terminal. The signal at the output terminal of amplifier A14 is the sum of the amplitude adapting signal and the gradient adapting signal and the combined adapting signal corresponds to the time or gradient adapting signal $V_{TIME}$ of FIGS. 2 and 3. It is to be noted that adjustments to the time adapting signal are made at a substantially fixed time after a low-to-high transition of the output signal of comparator A11. Thus a time adapting signal adjustment may even take place in an interval in which the steering signals exceed UPERLIM, if the adjustment is made before UPERLIM is actually exceeded. Otherwise, after the steering signals exceed UPERLIM, no adapting signal adjustments are made in an interval defined by the LOLIM transitions of the steering signals. The output terminal of amplifier A12 is connected to a switch SW5 across capacitor C5. At the end of an interval, i.e. when the steering signals fall below LOLIM, the output signal of A12 temporarily closes SW5 so that C5 is discharged and made ready for the next sampling cycle.

Both the diagrams of FIGS. 7 and 8 show three digital-to-analog signal converters. It is within the spirit of the invention to use a single converter and a multiplex means in place of the three converters in a fashion similar to multiplex arrangement of the system of FIG. 5.

Figure 9:
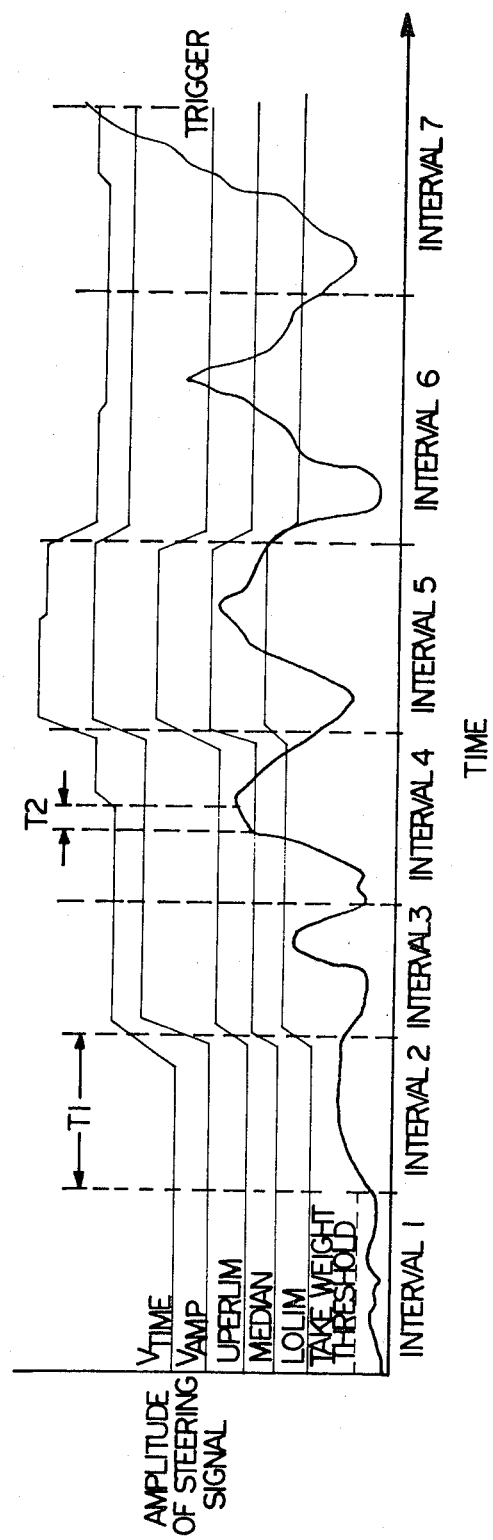
FIG. 9 is a graphical illustration of the variation of the adapting signals in response to sensor signals during the operation of an electronic ski binding incorporating the circuitry of FIG. 8.

FIG. 9 is a graphical illustration of the variation of the amplitude of a steering signal, the adapting signals and the adapting signal adjustment window during a period when the sensors are detecting steering signals. During time interval 1, just after power has been applied to the circuit, the adapting signals and adjustment window limits are determined by the initial values for weight, steering and gradient signals. During time interval 2, the conditions for measuring weight are satisfied and the skier's measured weight becomes part of the amplitude adapting signal shortly after T1, the duration of the weight timing pulse. During time interval 3, the steering signals do not exceed LOLIM so no adjustment to the adapting signals is made. In time interval 4, MEDIAN, but not UPERLIM, is exceeded so the adapting signals and the adjustment window are adjusted upward when the steering signals sink below LOLIM. The increase of the steering signals above LOLIM actuates the gradient detection network. Since the measured gradient is larger than the stored value, an upward adjustment in $V_{TIME}$ is made at T2, the end of the gradient timing pulse, after LOLIM is exceeded. In time interval 5, LOLIM, but not MEDIAN, is exceeded, so the adapting signals and adjustment window are adjusted downward at the end of the interval. Likewise, a decrease in gradient causes a downward adjustment in $V_{TIME}$ during the interval. In time interval 6, UPERLIM is exceeded so no adapting signal or window adjustment is made at the end of the interval. A downward change in the gradient is detected and an adjustment is made to $V_{TIME}$ during the interval before the steering signal exceeds UPERLIM. During this interval, if the circuit of FIG. 6 were employed, the VFC may be actuated and generate a few cycles of output signal $V_f$. But since too few cycles are generated, the trigger threshold is not exceeded in time interval 6 and the counting means of FIG. 6 would be reset to zero at the end of the interval. During time interval 7, the experience of interval 6 is repeated, except the $V_{TIME}$ is adjusted upward and the steering signals are sufficiently strong that the VFC generates enough output signal cycles to cause the generation of a trigger signal to actuate the release mechanism of the ski binding.

While the invention has now been described with reference to certain preferred embodiments, the skilled artisan will recognize that various substitutions, changes, modifications and omissions may be made without departing from the spirit thereof. Accordingly, it is intended that the scope of the invention be limited solely by the following claims.

I claim:

1. In an electronic safety ski binding having a release means actuable in response to a trigger signal for placing the binding in releasing condition from a locking condition, a system for actuating said release means, said system comprising:
   transducing means for generating electrical input steering signals corresponding to forces and moments applied to different portions of the ski binding;
   adapting signal generator means for generating adapting signals in response to preselected characteristics of the input steering signals;
   voltage-to-frequency converter means for converting, in response to the adapting signals, the transmitted input steering signal from each of said transducing means into an output signal having a frequency which is a function of a preselected characteristic of the adapting signal;
   counting means associated with each of said transducing means for counting the number of cycles of the output signal generated by the converter means in response to the input steering signals; and
   trigger means having means for establishing a trigger threshold, said trigger means generating a trigger signal whenever the number of cycles counted by any of the counting means exceeds the predetermined trigger threshold.

2. The invention of claim 1 wherein the preselected characteristics of the input steering signals to which said adapting signal generator responds, are the amplitude and time rate of change of the input steering signal.

3. The invention of claim 2 wherein said adapting signal generator means establishes an amplitude threshold, and the converter means includes means responsive to said adapting signals to generate an output signal only when the amplitude of a transmitted input steering signal exceeds said amplitude threshold.

4. The invention of claim 3 and further including means for automatically adjusting said adapting signals to compensate for the weight applied to the ski binding.

5. The invention of claim 2 wherein said converter means responds to said adapting signals to vary the frequency of the output signal inversely with the changes in the time rate of change of the respective input signals.

6. The invention of claim 1 wherein said transducing means generates an initial force signal according to the weight impressed thereon, and wherein the system further includes first initializing means for establishing an amplitude adapting signal according to said initial force signal.

7. The invention according to claim 1 and further including multiplex means for enabling transmission of the input signals from each of said transducing means in repetitive sequence.

8. The invention according to claim 1 and further including timing means for synchronizing the transmission of the input steering signals from the respective transducing means and the operation of said counting means.

9. The invention according to claim 1 wherein said adapting signal generating means generates adapting signals comprising a gradient adapting signal, said system further comprising:
   second initializing means for establishing an initial amplitude of the gradient adapting signal;
   adjustment means actuable for adjusting the amplitude of the gradient adapting signal according to the time rate of change of the respective input signals;
   gradient measuring means for generating a gradient signal reflective of the time rate of change of the amplitude of an input signal; and
   second actuating means electrically connected to said gradient measuring means for actuating the adjustment means in response to generation of a gradient signal.

10. The system of claim 1 for further processing input signals to produce a time output signal, said system further comprising:
    time output signal generating means responsive to the input steering signals for generating the time output signals;
    adjustment means actuable for adjusting the amplitude of the time output signal according to the time rate of change of the input steering signals;
    gradient measuring means for measuring the time rate of change of the amplitude of the input steering signal and for actuating said adjustment means in response to changes in the time rate of change of the input steering signals.

11. The system of claim 10 wherein said gradient measuring means includes means for actuating said adjustment means to adjust the amplitude of the time output signal upward if the measured gradient exceeds a predetermined value and downward if the measured gradient is less then the predetermined value.

12. The system of claim 11 wherein said gradient measuring means includes storing means for storing measured input signal gradients, and wherein said predetermined value is a stored input signal gradient.

* * * * *